(12) United States Patent
Jensen et al.

(10) Patent No.: US 6,496,035 B2
(45) Date of Patent: Dec. 17, 2002

(54) INTEGRATED CIRCUIT APPROACH, WITH A SERPENTINE CONDUCTOR TRACK FOR CIRCUIT CONFIGURATION SELECTION

(75) Inventors: Rune Hartung Jensen, Sunnyvale, CA (US); Yves Dufour, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/828,331

(22) Filed: Apr. 6, 2001

(65) Prior Publication Data

US 2001/0011909 A1 Aug. 9, 2001

Related U.S. Application Data

(63) Continuation of application No. 09/460,936, filed on Dec. 14, 1999, now Pat. No. 6,292,024.

(51) Int. Cl.[7] .............................................. H01L 25/00
(52) U.S. Cl. .......................... 326/47; 326/107; 257/208; 257/211; 438/128; 438/129
(58) Field of Search ........................... 326/38, 47, 101; 257/208, 211; 428/128, 129

(56) References Cited

U.S. PATENT DOCUMENTS 6,292,024 B1 * 9/2001 Jensen et al. .................. 326/47

* cited by examiner

Primary Examiner—Michael Tokar
Assistant Examiner—Vibol Tan
(74) Attorney, Agent, or Firm—John Vodopia

(57) ABSTRACT

An integrated circuit includes a serpentine conductor track extending through a plurality of conductor layers and having ends coupled to first and second circuit elements, the ends being in opposing outermost ones of the conductor layers. The serpentine conductor track can selectively be made to be (i) continuous and electrically couple the first and second circuit elements together or (ii) discontinuous so that the first and second conductor elements are not electrically coupled. In the latter case, the discontinuity can be formed in any one of the conductor layers and a bridging conductor track is further formed in that one conductor layer which is coupled to the serpentine conductor track and which bypasses either of the first and second circuit elements. This structure has the advantage that circuit changes can be made in any conductor layer. It has particular utility in the implementation of module ID circuits, where it is desirable to change the output of a module ID circuit to reflect a circuit revision in the integrated circuit. The change in the module ID circuit to alter its output can be made in the same conductor layer as that used to make the circuit revision, so that no additional mask changes are needed other than in the mask used for implementing the circuit change.

19 Claims, 5 Drawing Sheets

INTEGRATED CIRCUIT APPROACH, WITH A SERPENTINE CONDUCTOR TRACK FOR CIRCUIT CONFIGURATION SELECTION

RELATED APPLICATION

This is a continuation application of Ser. No. 09/460,936, filed on Dec. 14, 1999 now U.S. Pat. No. 6,292,024 (PHA 23,869C1) to which Applicant claims priority under 35 U.S.C. § 120.

FIELD OF THE INVENTION

The invention relates generally to conductor routing among circuit elements in an integrated circuit. More particularly, the invention relates to structure and a method which facilitate changing circuit operation in any one of the conductor layers in an integrated circuit.

BACKGROUND OF THE INVENTION

Integrated circuits ("ICs") typically have a substrate, an active region on the substrate containing a large plurality of circuit elements such a transistors, resistors, capacitors etc., and a region adjacent the active region which has a plurality of conductor layers and insulating layers interspersed between the conductor layers. The conductor layers each include a large number of conductor tracks which are used to provide power to the circuit elements, as well as for signal routing between the elements.

During design and testing of an integrated circuit, or even after an IC had been in production, it is often necessary or desirable to revise the circuit operation to remove faults or to otherwise improve circuit operation. At the most severe end of the spectrum of revisions, the changes may require modifications to the masks which define the content and arrangement of circuit elements on the substrate. More frequently, however, the designer has anticipated potential problems and has included sufficient circuit elements on the integrated circuit to fix the problem. For example, the designers may include a selection of buffer circuit elements to remove timing problems in the signal routing. It is then a matter of modifying the conductor routing so as to decouple and/or couple certain of the circuit elements so as to implement the fix.

Additionally, many chip designs incorporate an identification ("ID") module which is readable by software. The purpose of the module ID is to allow software to identify the hardware and, based on the ID, configure the chip and the corresponding software. As the industry moves to systems on a chip design, where proven circuit modules are "plugged into" the IC, it will be desirable for each module to have a corresponding ID module.

When making a circuit fix/enhancement to a particular module, it will typically be desirable to change the output of the module ID circuit, so that software will read a different ID code reflecting the change.

Traditional implementations of ID modules is done by Register Transfer Level ("RTL") implementation of a module ID register. In other implementations, the ID module is not a register at all, but simply constants which can be read by the software. In the case of a constant, the ID can not be changed by altering routing in one or more of the conductor layers, and a full new mask set may be required to implement the change in the ID. This is expensive in terms of cost of the mask set as well as in the schedule slippage required by the time to create new masks.

Other implementations allow the value of the module ID to be revised through changes in routing in the metal layers. However, in these known techniques, the required changes in the routing are typically in layers which are different than the layers used to implement the circuit fix which necessitated the revision of the module ID. Thus, additional mask changes are required.

SUMMARY OF THE INVENTION

Generally speaking, according to one aspect of the invention, an integrated circuit includes a plurality of circuit elements and a plurality of conductor tracks connected to the circuit elements, the plurality of conductor tracks being arranged in a stack of a plurality of conductor layers, the stack being bounded by first and second opposing outermost conductor layers. A cell includes a serpentine conductor track having a first end in the first outermost conductor layer and a second, opposing end in the second, opposing outermost conductor layer. The serpentine track extends successively from the first end to the second end through any conductor layers between the outermost conductor layers. The serpentine track further includes couplings which couple track portions of the serpentine conductor track, the couplings being alternately laterally offset from each other along the extent of the serpentine track through the conductor layers. The first end of the serpentine conductor track is coupled to a first of the circuit elements and the second end is coupled to a second of the circuit elements. Furthermore, the integrated circuit has one of (i) the serpentine conductor path forming a continuous electrical path between the first circuit element and the second circuit element, and (ii) the serpentine conductor path having a discontinuity in one of the conductor layers such that the first and second circuit elements are not coupled to each other and the integrated circuit further including a bridging conductor track in the same conductor layer as said discontinuity, which bridging track couples said serpentine conductor track to bypass one of said first and second circuit elements.

The serpentine conductor track situated between two circuit elements allows great flexibility in how these two circuit elements are decoupled from each other. In particular, since the track extends through all conductor layers, the two elements can later be decoupled from each other by creating a discontinuity in any of the conductor layers that the serpentine track passes through. Furthermore, one of the two circuit elements can be bypassed with a bridging conductor track which is situated in the same conductor layer. This means that the functionality of the two elements can be altered with a change in only one conductor layer, and which may be achieved in any of the metal layers. Alternatively, the two circuit elements may be originally decoupled, and in a later revision coupled to each other.

In another aspect of the invention, an ID module in an IC is comprised by the above described cell with first and second circuit elements and the serpentine track. The circuit elements may be logic gates, such as inverters. The ID module may include a plurality of the cells in parallel, each having an input which receives a common logic signal. Where the cells are configured identically, the output of each cell will be identical. However, the output of the group of cells can be selected by controlling the configuration of the cells, which can be done in any conductor layer. Additionally, where a circuit revision is accomplished in another part of the integrated circuit by changing the routing in a certain conductor layer, the output of the cell(s) of the ID module can be revised in the same conductor layer. Thus, the circuit change and the ID module change can be implemented with changes to only one mask. This ultimately reduces the cost attributed to the IC, by simplifying changes to the ID module and reducing mask costs.

The invention also relates to a method of manufacturing an IC with the above-described structure.

These and other objects, features and advantages of the invention will become apparent from the following detailed description and the drawings, both of which are illustrative and not limiting.

DESCRIPTION OF THE PREFERRED EMBODIMENT

Figure 1:
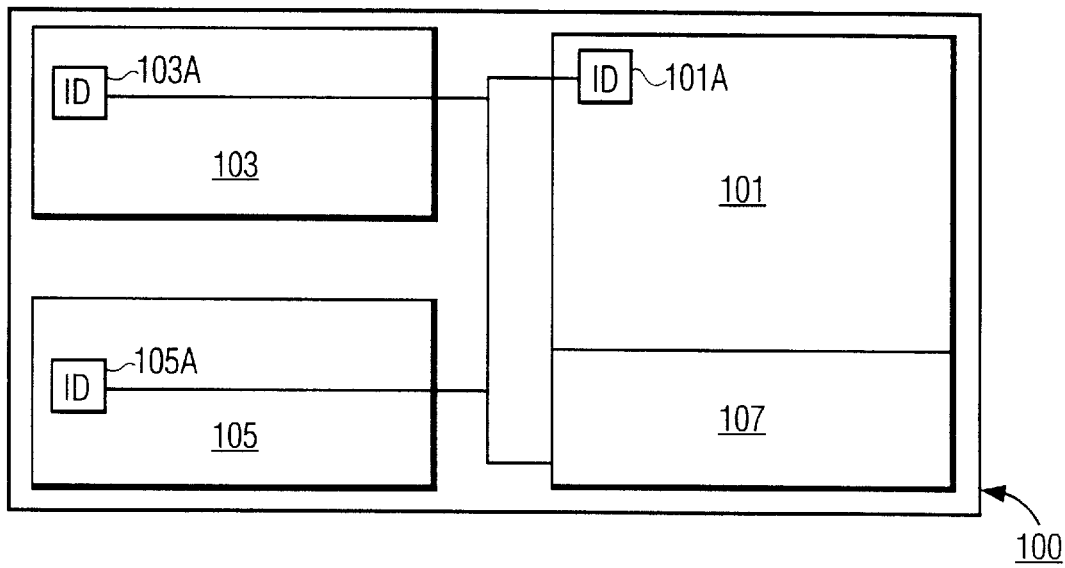
FIG. 1 diagrammatically illustrates an integrated circuit with a number of circuit modules and corresponding ID modules.

FIG. 1 illustrates an IC 100 having a plurality of circuit modules 101, 103, 105. Each of the circuit modules has a corresponding module ID circuit 101A, 103A, 105A. A circuit 107 provides a logic signal to each of the module ID circuits. The module ID circuits are coupled to an output pin of the IC so that the output of each module ID circuit can be read by an external device.

Figure 2:
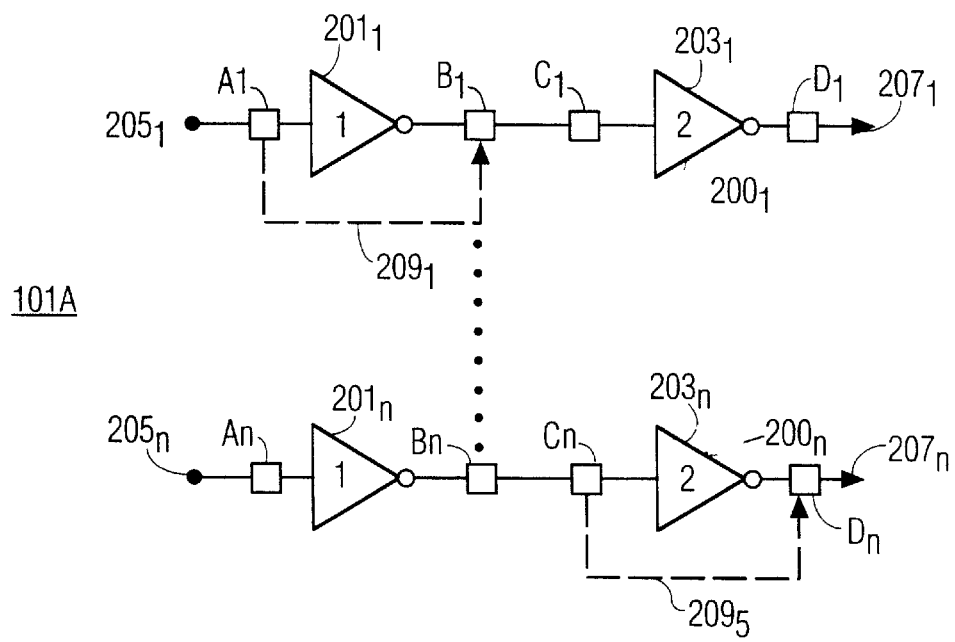
FIG. 2 illustrates cells of an exemplary identification module according to the invention.

FIG. 2 is a circuit diagram of an exemplary ID circuit 101A having a plurality of cells ($200_1$–$200_n$). Each cell includes an input ($205_1$–$205_n$), a first circuit element ($201_1$–$200_n$), a second circuit element ($203_1$–$203_n$) and an output ($207_1$–$207_n$). Each of the circuit elements is a logic gate in the form of an inverter. The cells are arranged in parallel to provide an identification code at the outputs 207 in response to a common logic signal applied to all of the cells at the inputs 205. For example, if n=5 and a logic "0" is applied to each of the inputs 205, the ID code output will be (0 0 0 0 0) since each cell is shown configured simply as a buffer. To change the code, one or more of the cells are configured to bypass one of the inverters. FIG. 2 shows the cell $200_1$ optionally being configured to bypass the first inverter $201_1$, as represented by the dashed bridging conductor $209_1$. Alternatively, a bridging conductor could bypass the second inverter, such as illustrated with dashed conductor $209_5$ for the cell $200_5$. If the first and fifth cells were so modified and the input kept the same, the output would then be (1 0 0 0 1). Generally, more cells would be included in each ID module, such as 32 to form a 32 bit ID.

While FIG. 1 shows each circuit module having a respective ID module for each circuit module, this is for a system on a chip implementation. ICs for other applications could have only some of the circuit modules with ID module's, or only one ID module for the IC.

As is well known in the art, generally, individual circuit elements are formed on top of a substrate of the integrated circuit. Connections to the individual transistors, resistors, capacitors to provide a source of potential as well as for signal routing are accomplished with conductor tracks arranged in a plurality of layers. The conductor tracks are typically of a metal, such as an alloy of aluminum or copper. The conductor layers are separated by an electrically insulating layer, such as silicon dioxide as one of many examples.

FIGS. 3(A)–3(E) illustrate various embodiments of a cell $200_1$ at the conductor layer level in a side cut away view while FIGS. 4(A)–4(E) are corresponding top diagrammatic views. The cell can be seen in FIGS. 3 as having 6 layers of conductors defined by a first outermost conductor layer m1, a second outermost conductor layer m6, and four intervening conductor layers m2–m4. Intervening insulating layers are not shown for purposes of clarity. Nodes A, B and D are formed by "stacked vias" formed respectively at node A by vias VA1–VA5, at node B by vias VB1–VB5 and at node C by vias VC1–VC5. As used herein 'stacked vias' means a plurality of aligned vias interconnecting conductors in a plurality of different layers. Some processes/layout software do not allow this and in such processes the vias will not be aligned with each other. Thus, in this embodiment a connection can be made at nodes A, B and D in any conductor layer. The input I1i of inverter $201_1$ is coupled to node A by track TA6 at conductor layer m6 while its output I1o is coupled to node B by track TB6 also in conductor layer m6. Similarly, the output I2o of the second inverter 203 is coupled to the node D by track TD6 at the upper conductor layer m6.

Figure 3A:
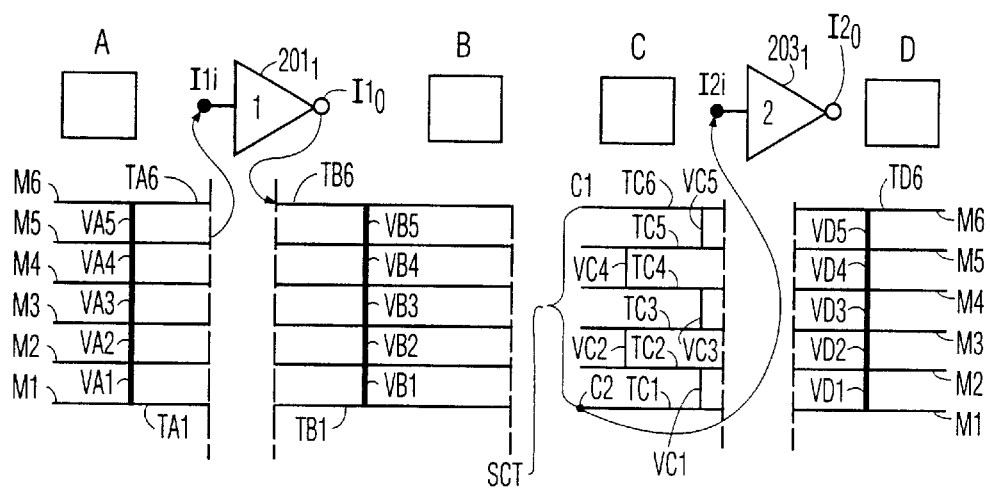
FIGS. 3(A)–3(E) are diagrammatic, side cut-away views illustrating various embodiments of the conductor routing of a cell of FIG. 2.

The node C has a special configuration which permits the first inverter or second inverter to be electrically bypassed during manufacturing to change its output, to thereby change the cell output and the module ID. The node C is formed by a serpentine conductor track SCT having one end C1 in the upper conductor layer m6 coupled to the node B and a second end C2 coupled to the input I2i of the second inverter in the lower conductor layer m1. The track SCT extends from the end C1 in layer m6 through successive conductor tracks in layers m5, m4, m3 and m2 to the lower conductor layer m1 to the second end C2. The connections between the tracks in layers m6 and m5 is made by a via VC5, and connections between tracks in successive lower layers is made by vias VC4, VC3, VC2 and VC1. As shown in FIG. 3(A) the vias VC5, VC3 and VC1 are laterally offset from the vias VC2 and VC4, forming two laterally spaced columns of vias. Thus, the node C as illustrated in FIG. 3 is formed by serpentine or zigzag path which extends from end C1 across the track portion TC6 in layer m6, through via VC5 to track portion TC5, back across track portion TC5 to via VC4, through via VC4 and across track portion TC4 to and through via VC3, back across track portion TC3 in conductor layer m3, through via VC2 across track portion TC2, and through via VC1 and across track portion TC1 in the layer M1 to the end C2. The significance of the structure of node C as opposed to the other nodes is that it provides track portions TC5, TC4, TC3, TC2 between the successive laterally offset vias VC5, VC4, VC3, VC2 and VC1. These portions along with track portions TC6 and TC1can be provided with a gap during manufacture so as to decouple the output of the first inverter from the input of the second inverter in any conductor layer.

In the configuration of FIG. 3A, the first and second inverters are coupled in series. The logic signal for generating the ID code may be input at node A at any of the conductor levels. By reason of the stacked vias VA1–VA5, the signal will be supplied to the input I1i of inverter 201 on track TA6 (see also FIG. 4(A)). The inverted logic signal will be produced at the output of the inverter $201_1$. The inverted output is supplied by track TB6 to the end C1 of the serpentine track SCT. Since the track SCT forms a continuous electrical path as shown in FIG. 3a, the track SCT provides the inverted output of inverter $201_1$ to the input of the second inverter $203_1$. The output of the inverter 203 is provided at node D. The output of the cell so configured will be the same as the input.

Figure 3B:
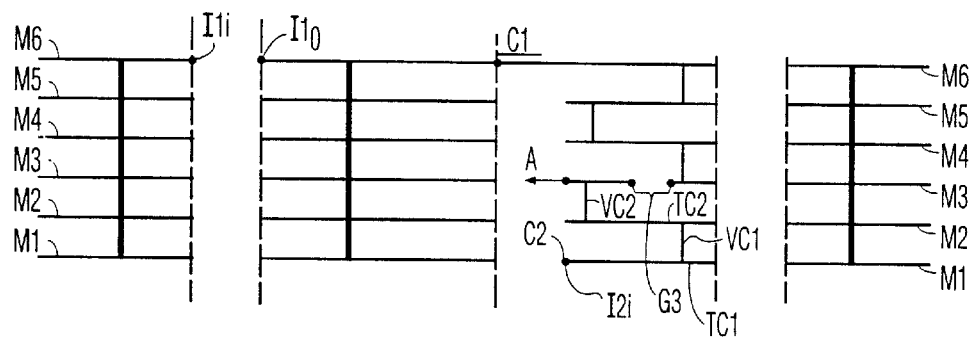

Suppose that a change needs to be made to the circuitry of module 101, and this change is effected by changing the routing of certain conductors in the conductor layer m3. Changing the conductor track routing in the layer m3 requires that a new mask be made to create the desired routing. To reflect the change in the circuit module 101, it will also be desirable to change the module ID code. This is accomplished by changing the output of one or more of the cells $200_1$–$200_n$ which makes up the ID module 101A. The IC according to the invention allows the necessary cell modifications of the ID module to be made in the same conductor layer (in this case layer 3) and with the same mask as used for making the change in the circuit module. This avoids the necessity of making more than one new mask. This is accomplished during manufacture of the IC by creating a discontinuity in one of the track portions of the serpentine conductor track SCT of the cell(s) which need to be modified. In the embodiment of FIG. 3B, the discontinuity is created to decouple the output I1o of the first inverter from the input I2i of the second inverter. Additionally, an end of the track portion in which the discontinuity is formed must also be coupled to the node A so that the input signal is provided to the input of the second inverter.

In FIG. 3(B), the track portion TC3 is provided with a discontinuity in the form of a gap G3. An end $TC3_1$ of track portion TC3 is coupled to the node A by providing a bridging conductor track BT3 which extends in the conductor layer 3 to the conductor track TA3 of node A from end $TC3_1$ (see FIG. 4(B)). The connections of tracks TA6, TB6 and TC6 remain physically the same (no change) but are shown in dashed lines to indicate that these conductor tracks no longer form the signal path. If the logic input signal is provided at the track TA6, the signal path then extends from track TA6, through vias VA5, VA4 through track TA3, bridging track BT3 to point $TC3_1$, via VC2, across track portion TC2, through via VC1 and back across track TC1 whose end C2 is coupled to the input of inverter 203. Thus, the cell $200_1$ has been changed from the buffer configuration of FIGS. 3(A); 4(A) to an inverter configuration.

Figure 3C:
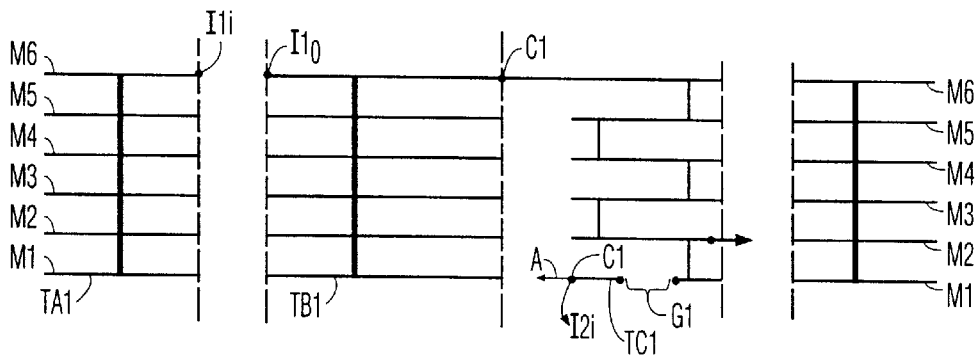
Figure 4A:
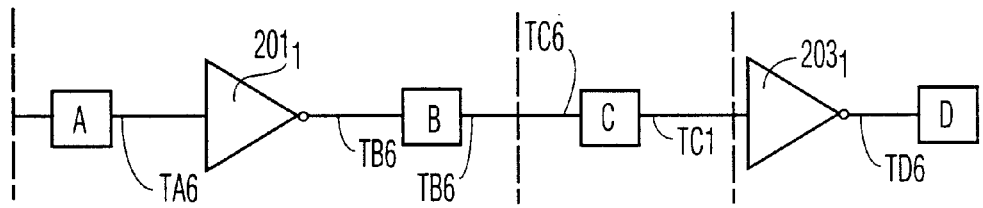
FIGS. 4(A)–4(E) are diagrammatic top views corresponding to FIGS. 3(A)–3(E).
Figure 4B:
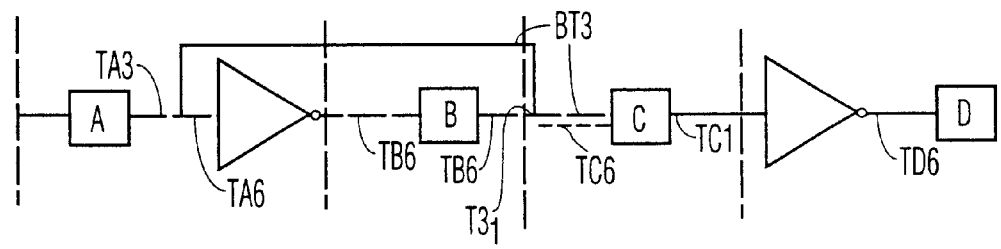
Figure 4C:
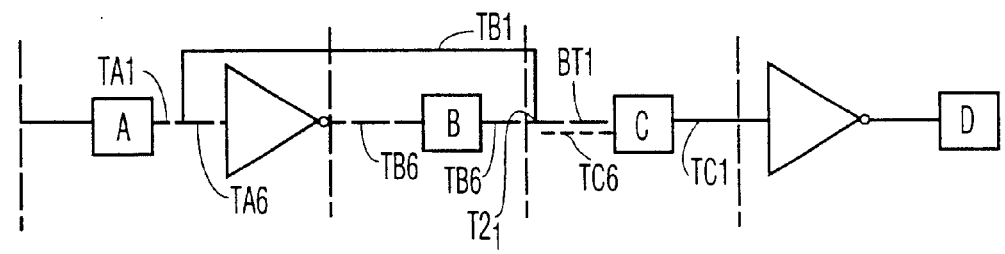
Figure 4D:
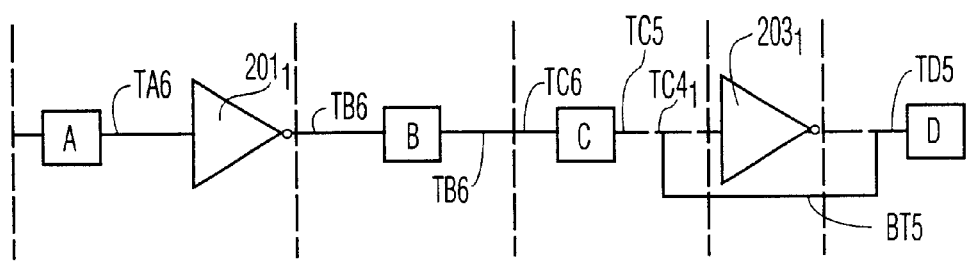

FIGS. 3(C) and 4(C) show how a similar change can be made in the lowest conductor level m1 by providing a gap G1 in the track portion TC1 and by providing a bridging track BT1 in the same conductor level m1 around the first inverter from node A at track TA1 to end C2. In this case, the connection from node A essentially bypasses the track SCT.

Figure 3D:
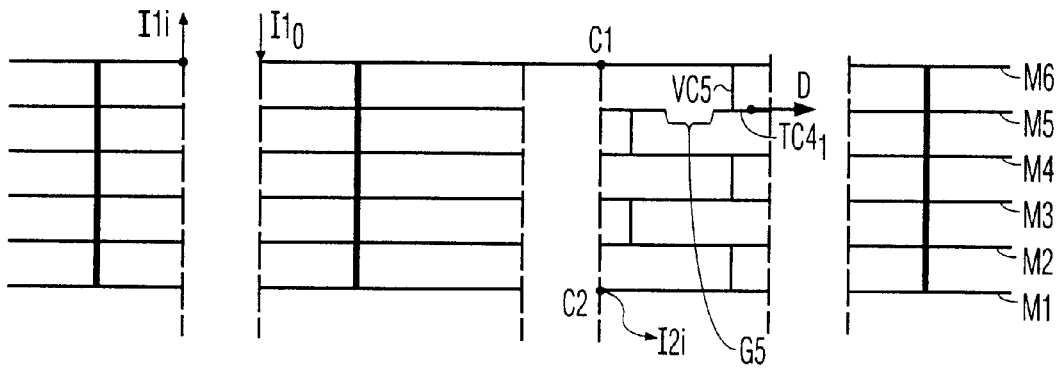
Figure 3E:
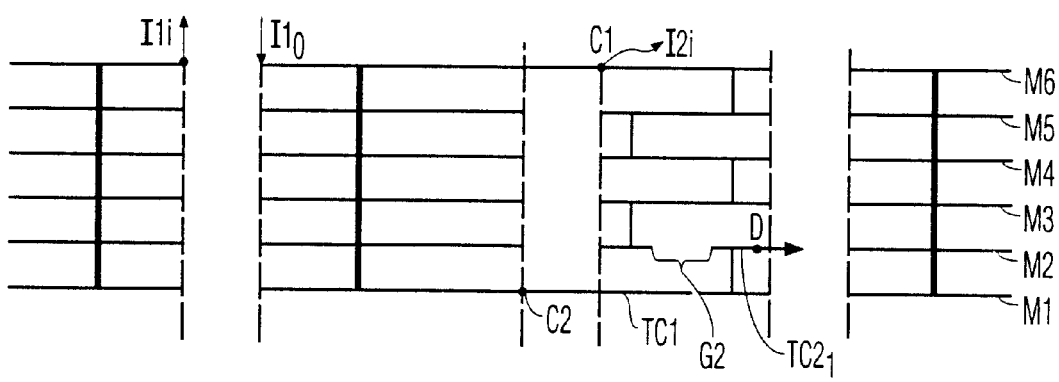

FIGS. 3(D); 4(D) show an alternative embodiment in which the serpentine track SCT is used to bypass the second cell element, in this case inverter $203_1$. In FIG. 3(D) a gap G5 is placed in the conductor track TC5, which disconnects the output of the inverter $201_1$ from the input of inverter $203_1$. The inverter $203_1$ is bypassed by providing a bridging track BT5 in the same conductor level m5. Thus, the signal path extends from the node A through the inverter $201_1$ across tracks TB1, TC1 and through via VC5 to point $TC4_1$, which point is coupled to node D via track BT5.

Figure 4E:
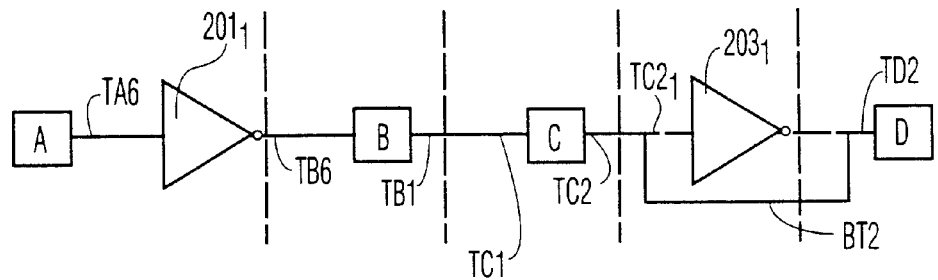

FIGS. 4(E); 5(E) similarly show the second inverter being bypassed, but with different signal routing from the output of the first inverter. In this case, the end C2 of the track SCT is coupled to the track TB1 and the end C1 is coupled to the input of the second inverter 203, which is the opposite of the previous embodiments. The end C1 of the serpentine conductor track is coupled to the output of the first inverter at the first conductor level m1 through the vias VB5, VB4, VB3, VB2, VB1. The point $TC2_1$ is coupled to the node D via a bridging track BT2 in the second conductor level.

The above embodiments illustrate the flexibility of the serpentine conductor track according to the invention. As long as one end is coupled to one circuit element at the first outermost conductor level and the other end is coupled to the other circuit element at the second, opposing outermost conductor level, then the serpentine track can be used to break the electrical coupling between the two devices in the outermost conductor levels and any intervening conductor levels. A bridging track can then be placed in the same conductor level to bypass either of the first and second circuit elements of the cell.

The alternating arrangement of the vias of the serpentine conductor track provide lateral space between the vias in which the gap can be formed in any conductor layer. However, the footprint of the track can be quite small, depending on the technology. For example, the spacing between the even and odd numbers of vias can be as small as 0.26 $\mu$ for a 0.18 micron process. Favorably, the vias are arranged in two columns, but where space is not critical, other configurations could be used.

The invention is not limited to just the number of layers shown in the embodiment, but is applicable to technologies with more or less, and even or odd, numbers of conductor layers. Additionally, favorably the "outermost conductor layers" will bound all of the conductor layers on the IC to allow the circuit revision to occur in any one of all of the conductor layers. However, as the technology expands to include ICs with ever greater numbers of conductors, it is feasible that sufficient flexibility will be achieved for some purposes when the serpentine track spans less than all of the conductor layers on an IC.

It should be understood from the foregoing that cells can initially be configured with one of the circuit elements bypassed, and then in a later revision to the IC, the bridging conductor track removed and the gap deleted, so as to electrically couple the first and second inverters together.

In the examples shown in FIGS. 3(A)–3(C) where the bridging conductor is connected to node A, it should be clear that nodes B and D do not require stacked vias, or even that the conductors in the different layers of nodes B, D be electrically connected. It is only necessary that any layer in node A be available to the bridging conductor from the same layer in node C (having the discontinuity). Similarly, in the embodiments of FIGS. 3(c), 3(D), only the node D requires stacked vias. The stacked vias were shown in all embodiments at nodes A, B and D, however, since typically cell elements are standardized in a cell library, and from a uniformity standpoint, it is advantageous that both ends of the logic element be available in all conductor layers by stacked vias.

While inverters have been shown as the logic gates, other logic gates could be used as well.

The structure and method described above are not limited to the use of module ID circuits, but in any situation where it would be desirable to change the connection of two circuit elements in any one of a plurality of conductor levels. For example, where changes in one part of a circuit are foreseen to require changes in a second part of a circuit, it would be desirable to include the serpentine structure in the second part of the circuit so that the changes therein can be made in the same conductor layer and with the same mask as the changes in the first part of the circuit.

It is understood in the art that routing software is used to lay out the conductor tracks in the various conductor layers. Generally, the software is designed to align the vias, as shown for example with nodes A, B and D. Thus a layout engineer would have to "hard block" this functionality in the software to generate the serpentine track. Also, the original layout of the cell, in the first version of the IC, would have to be provided with obstruction layers in all conductor layers to avoid the typical software routing tool from routing over the cell. This guarantees that a metal fix will always be available in any metal layer.

The technology by which the invention is made is not important and any of the standard bipolar or CMOS processes can be used.

Although preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An integrated circuit, comprising:
   a stack of conductor layers, the stack including a first conductor layer, an inner conductor layer, and a second conductor layer respectively carrying first, inner and second conductors;
   a plurality of circuit elements respectively connected to the first and second conductors;
   a serpentine conductor track including the first, inner and second conductors and having a discontinuity in the second conductor; and
   a bridging conductor track located in the inner layer and arranged to connect the serpentine conductor track to bypass one of the circuit elements,
   further including an identification circuit adapted to generate an identification code, the identification code being defined at least in part by at least one of the circuit elements and the bridging conductor track.

2. The integrated circuit of claim 1, wherein each of the circuit elements includes a logic gate.

3. An integrated circuit, comprising:
   a stack of conductor layers, the stack including a first conductor layer, an inner conductor layer, and a second conductor layer respectively carrying first, inner and second conductors;
   a plurality of circuit elements respectively connected to the first and second conductors;
   a serpentine conductor track including the first, inner and second conductors and having a discontinuity in the second conductor; and
   a bridging conductor track located in the inner layer and arranged to connect the serpentine conductor track to bypass one of the circuit elements,
   further including an identification circuit adapted to generate an identification code, the identification code being defined at least in part by at least one of the circuit elements and the bridging conductor track, and wherein the identification code is passed through said at least one of the circuit elements.

4. An integrated circuit, comprising:
   a stack of conductor layers, the stack including a first conductor layer, an inner conductor layer, and a second conductor layer respectively carrying first, inner and second conductors;
   a plurality of circuit elements respectively connected to the first and second conductors;
   a serpentine conductor track including the first, inner and second conductors and having a discontinuity in the second conductor; and
   a bridging conductor track located in the inner layer and arranged to connect the serpentine conductor track to bypass one of the circuit elements,
   further including couplings adapted to intercouple the first, inner and second conductors between the layers, the couplings arranged alternatively laterally offset from each other along the serpentine track through the respective conductor layers.

5. The integrated circuit of claim 4, wherein the first, inner and second conductors are aligned over one another.

6. An integrated circuit, comprising:
   a stack of conductor layers, the stack including a first conductor layer, an inner conductor layer, and a second conductor layer respectively carrying first, inner and second conductors;
   a plurality of circuit elements respectively connected to the first and second conductors;
   a serpentine conductor track including the first, inner and second conductors and having a discontinuity in the second conductor; and
   a bridging conductor track located in the inner layer and arranged to connect the serpentine conductor track to bypass one of the circuit elements,
   wherein the inner layer is a buried layer on one side of each of the first and second conductors, and further including:
      an identification circuit adapted to generate an identification code, the identification code being defined at least in part by at least one of the circuit elements and the bridging conductor track, and wherein the identification code is passed through said at least one of the circuit elements; and
      couplings adapted to intercouple the first, inner and second conductors between the layers, the couplings arranged alternately laterally offset from each other along the serpentine track through the respective conductor layers, and wherein the first, inner and second conductors are aligned over one another.

7. An integrated circuit, comprising:
   a stack of a plurality of conductor layers, the stack including a first conductor layer and a second conductive layer;
   a first circuit having a first node and a second node;
   a second circuit having a first node and a second node;
   a first plurality of vias interconnecting conductors on a plurality of different conductor layers, the first plurality of interconnecting conductors coupled to the first node of the first circuit;
   a second plurality of vias interconnecting conductors on the plurality of different conductor layers, the second plurality of interconnecting conductors coupled to the second node of the second circuit; and
   a serpentine conductor track having (i) a first end in the first conductor layer, (ii) a second end in the second conductor layer, the serpentine conductor track forming a continuous electrical path extending serially from the first end to the second end through the different conductor layers, and (iii) couplings between the different conductor layers, the couplings being alternately lateral offset from each along the extent of the serpentine track through conductor layers.

8. The integrated circuit of claim 7, wherein the first and second circuits are circuit elements.

9. The integrated circuit of claim 7, wherein the first conductor layer is an outermost conductive layer, the second conductor layer is an opposing outermost conductive layer, and the stack of a plurality of conductor layers is bounded by the first conductor layer and the second opposing outermost conductive layer.

10. An integrated circuit, comprising:

a first conductor layer;

a second conductor layer;

a first circuit element;

a second circuit element;

at least one serpentine conductor track; and one of the serpentine conductor track forming a continuous electrical path between the first circuit element and the second circuit element, and the serpentine conductor track having a discontinuity in at least one of the conductor layers such that the first and second circuit elements are not coupled to each other and the integrated circuit further including a bridging conductor track in the same conductor layer as said discontinuity, which bridging track couples said serpentine conductor track to bypass one of said first and second circuit elements.

11. A method for manufacturing an integrated circuit, comprising the steps of:

forming a stack of conductor layers including first, inner and second conductors with conductors respectively on each of the first, inner and second conductors, providing a region for forming a bridging conductor track located in the inner layer and connecting the serpentine conductor track to bypass one of a plurality of circuit elements;

forming a serpentine conductor track to interconnect a plurality of circuit elements in the integrated circuit, the serpentine conductor track including the first, inner and second conductors respectively along first, inner and second conductor layers of the stack of conductor layers;

wherein forming the serpentine conductor track includes forming the inner conductor to include a lateral segment that can be severed to provide a discontinuity in the serpentine conductor track and to thereby provide an altered configuration of the integrated circuit; and providing an integrated circuit configuration by selecting at least one of (i) severing the lateral segment and thereby providing the discontinuity in the serpentine conductor track; and (ii) forming the bridging conductor track at the region of the inner layer and thereby connecting the serpentine conductor track to bypass one of the circuit elements, and wherein the serpentine conductor track and the plurality of circuit elements form part of an identification circuit, and wherein providing an integrated circuit configuration defines an identification code for the integrated circuit.

12. The method claim 11, wherein each of the circuit elements includes a logic gate.

13. The method claim 11, wherein the identification code is passed through at least one of the circuit elements.

14. The method claim 11, further including forming couplings intercoupling the first, inner and second conductors between the layers, the couplings arranged alternately laterally offset from each along the serpentine track through the respective conductor layers.

15. The method claim 11, wherein the first inner and second conductors are aligned over one another.

16. The method claim 11, wherein providing an integrated circuit configuration includes severing the lateral segment and thereby providing the discontinuity in the serpentine conductor track.

17. The method claim 11, wherein providing an integrated circuit configuration includes forming the bridging conductor track at the region of the inner layer and thereby connecting the serpentine conductor track to bypass one of the circuit elements.

18. The method claim 11, wherein providing an integrated circuit configuration includes severing the lateral segment and thereby providing the discontinuity in the serpentine conductor track, and forming the bridging conductor track at the region of the inner layer and thereby connecting the serpentine conductor track to bypass one of the circuit elements.

19. A method for manufacturing an integrated circuit, comprising:

using a stack of conductor layers, forming a serpentine conductor track to interconnect a plurality of circuit elements, the serpentine conductor track including first, inner and second conductors respectively along first, inner and second conductor layers of the stack of conductor layers;

forming a discontinuity in the inner conductor; and forming a bridging conductor track located in the inner layer and arranged to connect the serpentine conductor track to bypass one of the circuit elements.

* * * * *